US011306830B2

(12) United States Patent
Kondo et al.

(10) Patent No.: US 11,306,830 B2
(45) Date of Patent: Apr. 19, 2022

(54) VALVE DEVICE

(71) Applicant: FUJIKIN INCORPORATED, Osaka (JP)

(72) Inventors: Kenta Kondo, Osaka (JP); Tsutomu Shinohara, Osaka (JP); Tomohiro Nakata, Osaka (JP); Hidenobu Sato, Osaka (JP)

(73) Assignee: FUJIKIN INCORPORATED, Osaka (JP)

(*) Notice: Subject to any disclaimer, the term of this patent is extended or adjusted under 35 U.S.C. 154(b) by 0 days.

(21) Appl. No.: 17/262,984

(22) PCT Filed: May 31, 2019

(86) PCT No.: PCT/JP2019/021711
§ 371 (c)(1),
(2) Date: Jan. 25, 2021

(87) PCT Pub. No.: WO2020/026579
PCT Pub. Date: Feb. 6, 2020

(65) Prior Publication Data
US 2021/0285552 A1 Sep. 16, 2021

(30) Foreign Application Priority Data
Jul. 31, 2018 (JP) .............................. JP2018-143713

(51) Int. Cl.
F16K 7/16 (2006.01)
F16K 25/00 (2006.01)
F16K 11/02 (2006.01)

(52) U.S. Cl.
CPC .............. F16K 7/16 (2013.01); F16K 25/005 (2013.01); F16K 11/022 (2013.01)

(58) Field of Classification Search
CPC ......... F16K 25/005; F16K 7/16; F16K 11/022
See application file for complete search history.

(56) References Cited

U.S. PATENT DOCUMENTS 5,485,984 A 1/1996 Itoi et al.
10,724,644 B2* 7/2020 Aoyama ............... F16K 31/143
(Continued)

FOREIGN PATENT DOCUMENTS

JP 2013-119877 6/2013
JP 2015-036563 2/2015
(Continued)

OTHER PUBLICATIONS

International Search Report issued in International Patent Application No. PCT/JP2019/021711, dated Sep. 3, 2019.
(Continued)

Primary Examiner — Michael R Reid
(74) Attorney, Agent, or Firm — Greenblum & Bernstein, P.L.C.

(57) ABSTRACT

A valve device includes a valve body; a valve seat; an inner disk made of a metal alloy having an inner annular portion, outer annular portion and a connecting portion that connects the inner annular portion and the outer annular portion; a diaphragm made of a metal alloy covering the inner disk and the valve seat and moving between an open position at which the diaphragm does not contact the valve seat and a closed position at which the diaphragm contacts the valve seat to enable and shuts off communication between the first flow path and the second flow paths; and a presser adapter that presses a peripheral edge portion of the diaphragm toward the outer annular portion; and the inner disk has a hardness higher than the valve seat and lower than both the valve body and the diaphragm.

8 Claims, 8 Drawing Sheets

(56) References Cited

U.S. PATENT DOCUMENTS

| | | | |
|---|---|---|---|
| 2002/0092999 A1 | 7/2002 | Longo et al. | |
| 2007/0045587 A1* | 3/2007 | Kolenc | F16K 1/422 251/331 |
| 2014/0326915 A1 | 11/2014 | Kitano et al. | |
| 2016/0131269 A1 | 5/2016 | Ishibashi et al. | |
| 2019/0128433 A1 | 5/2019 | Aoyama | |

FOREIGN PATENT DOCUMENTS

| | | |
|---|---|---|
| JP | 2017-223318 | 12/2017 |
| TW | 201516299 A | 5/2015 |

OTHER PUBLICATIONS

Written Opinion issued in International Patent Application No. PCT/JP2019/021711, dated Sep. 3, 2019.

Taiwanese Office Action in related Taiwanese Application No. TW20190120055 (108120055), dated May 25, 2021.

\* cited by examiner

[fig.1]
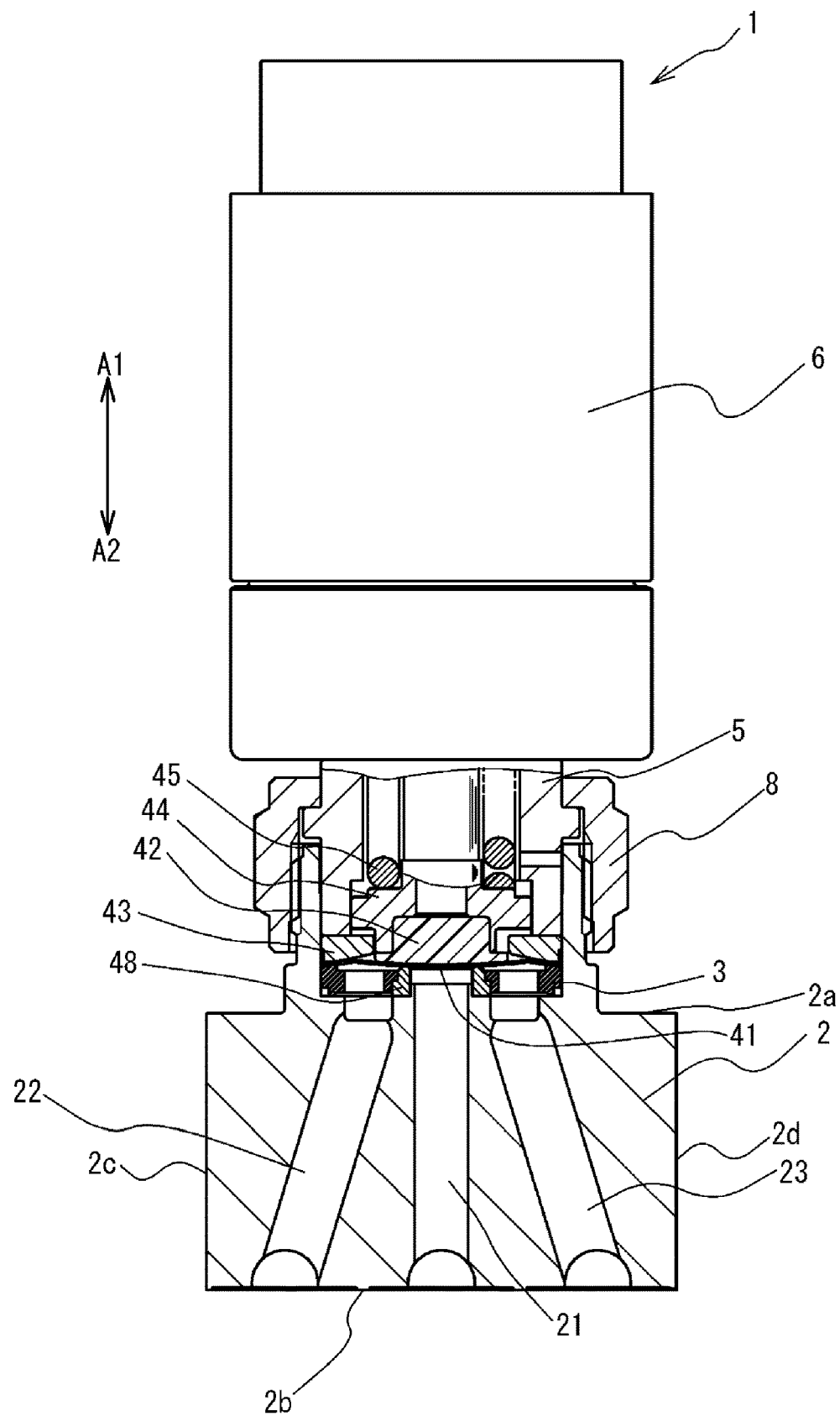

[fig.2]
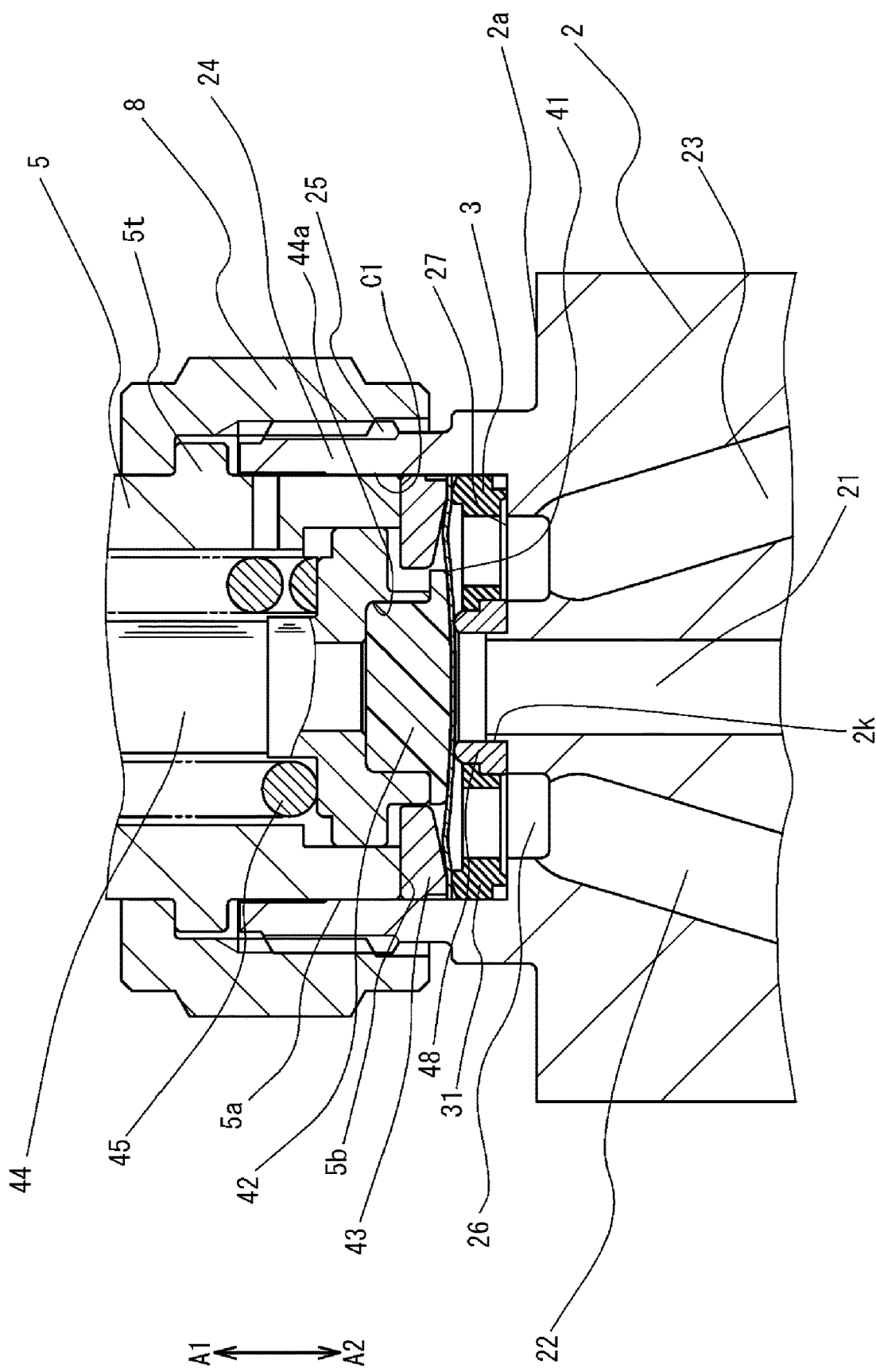

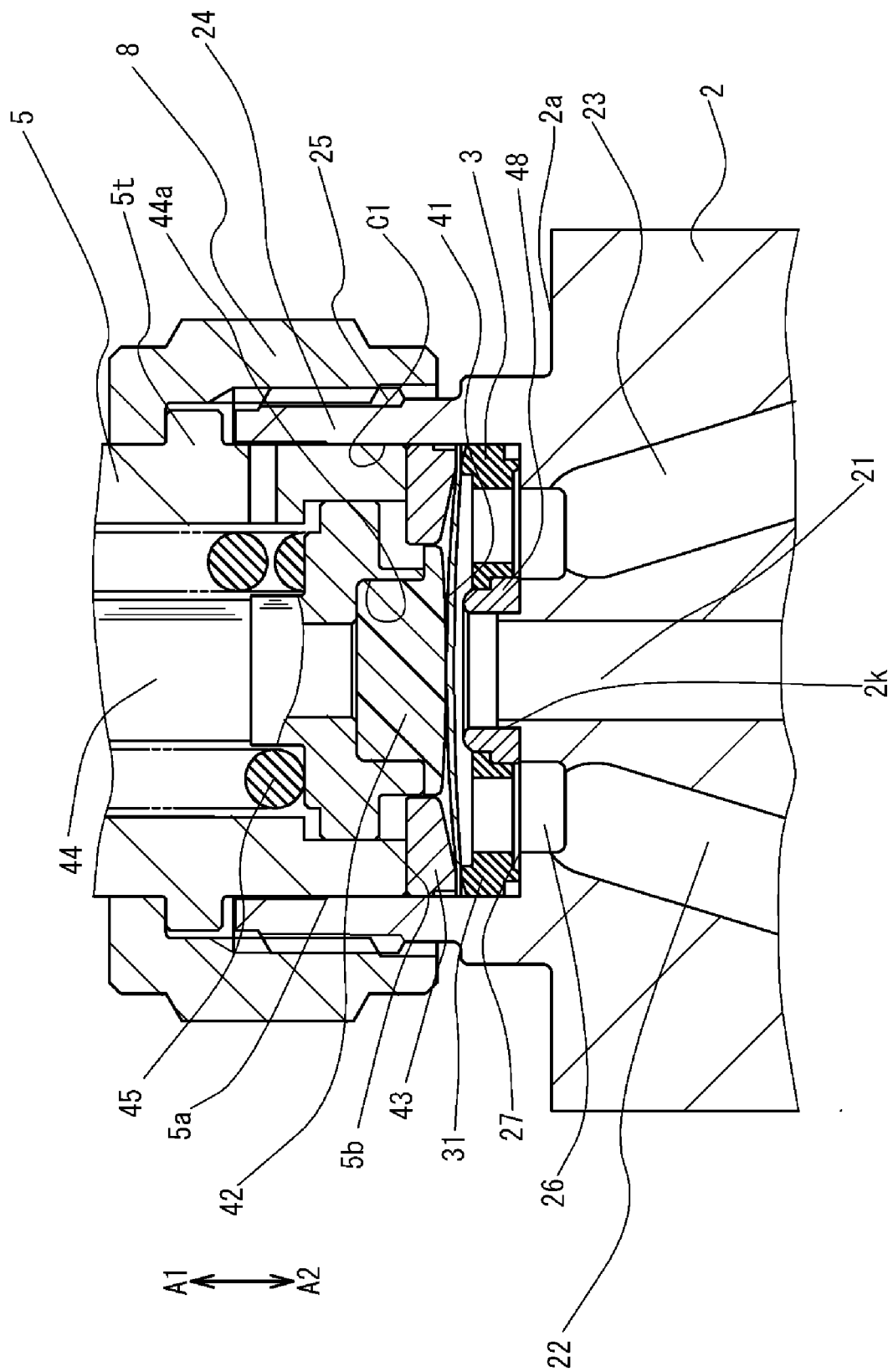
[fig.3]

[fig.4A]
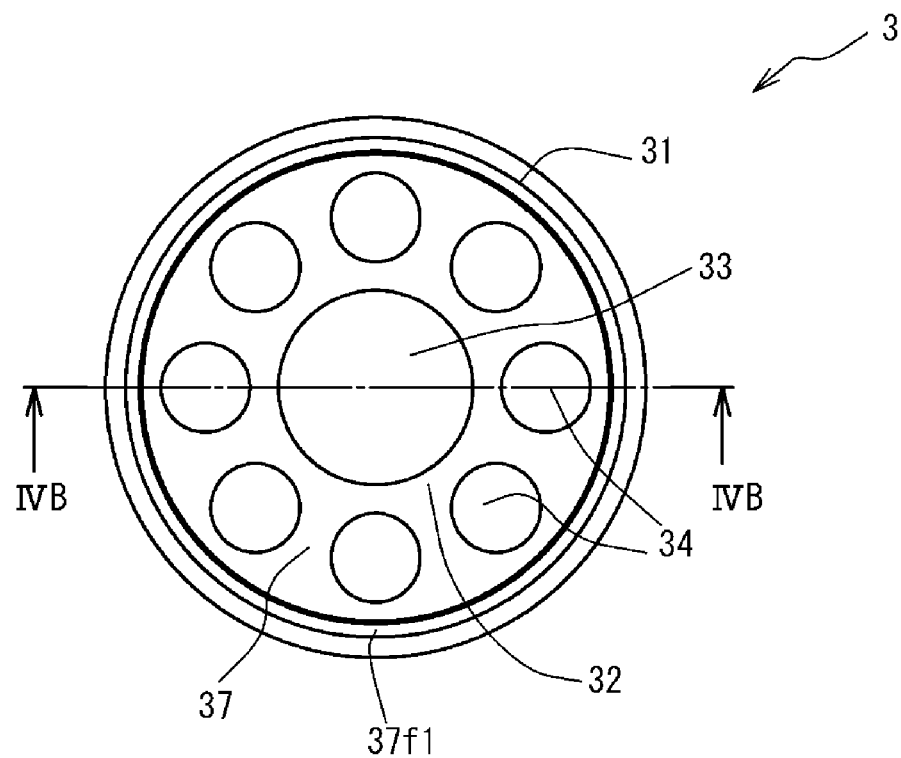
[fig.4B]
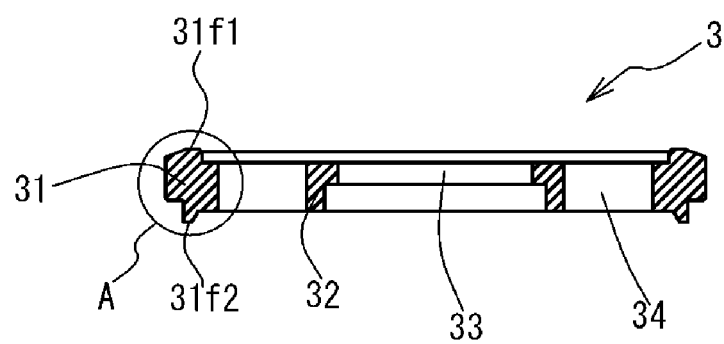

[fig.5]
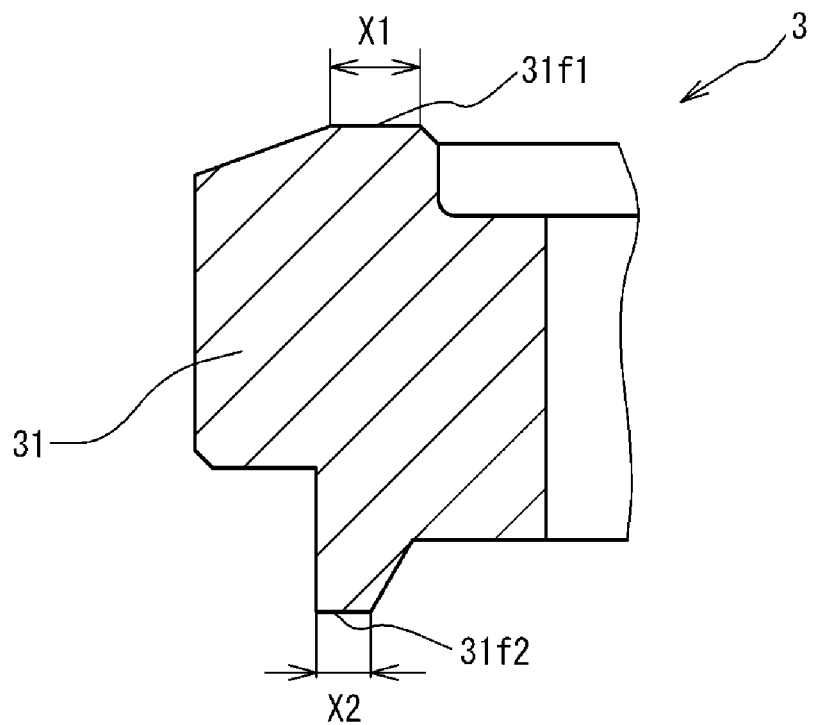
[fig.6]
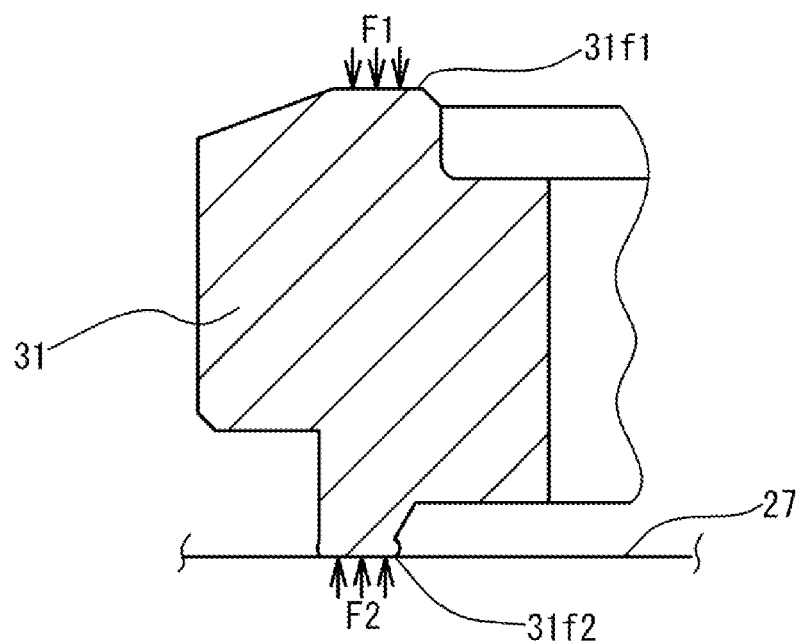

[fig.7]
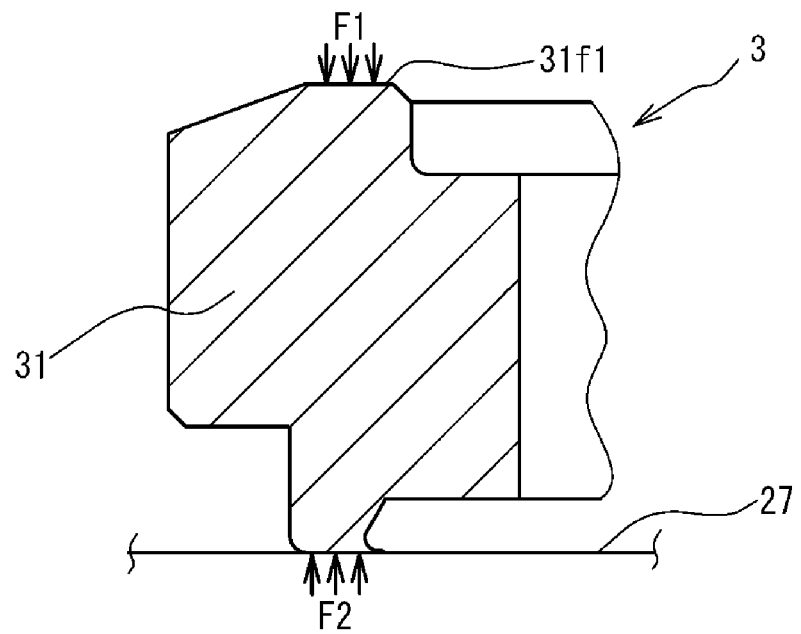

[fig.8]
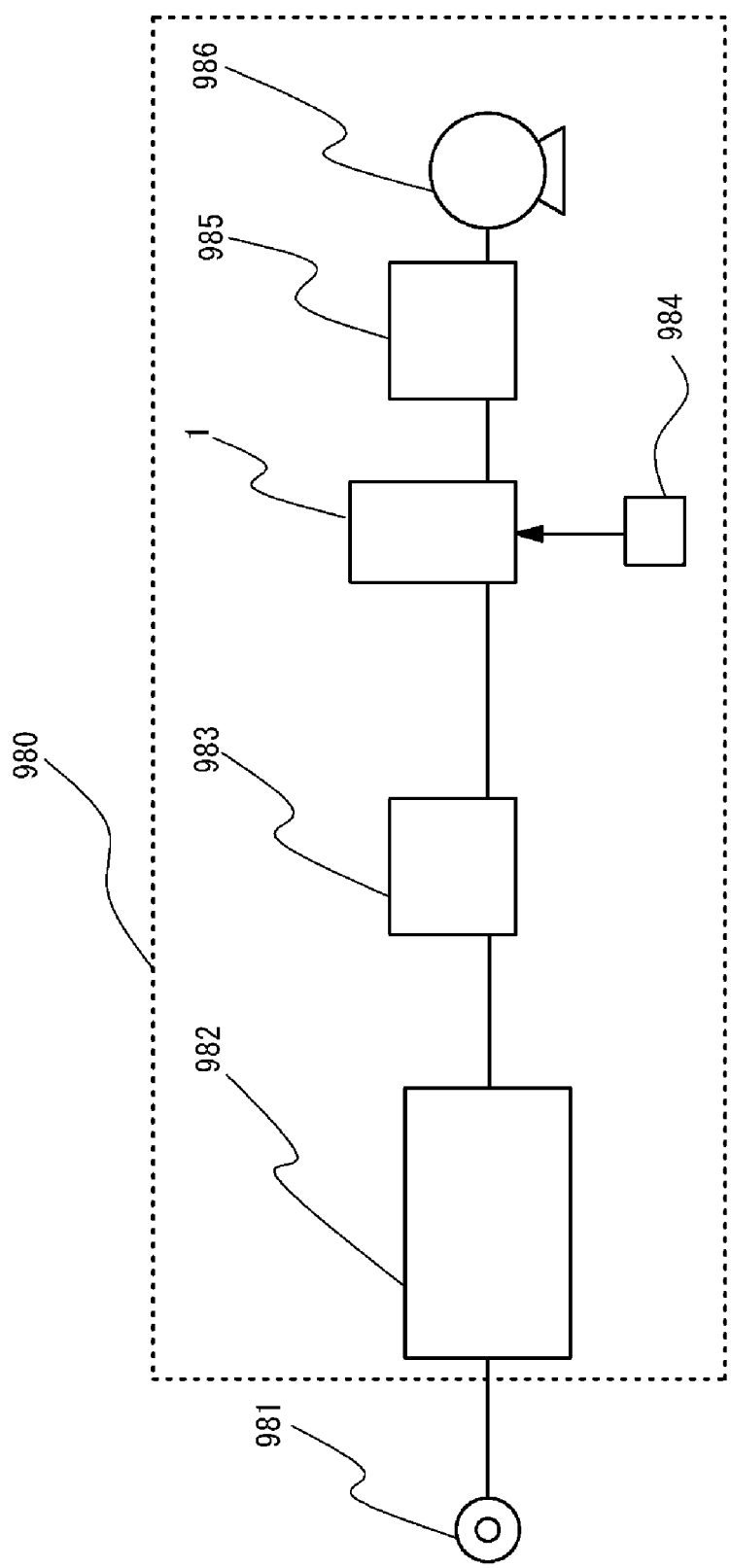

[fig.9]
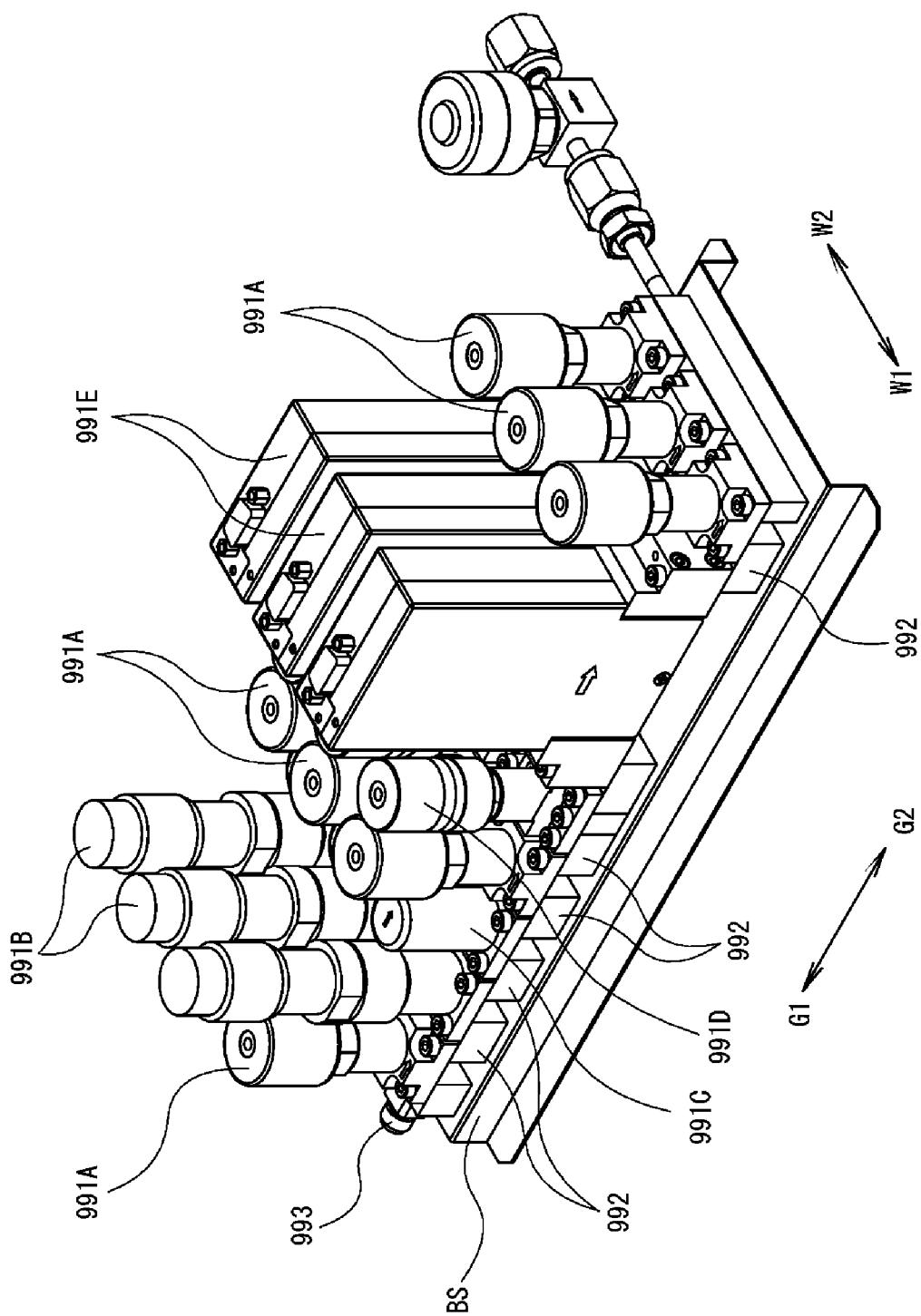

VALVE DEVICE

TECHNICAL FIELD

The present invention relates to a valve device, a fluid control device, a fluid control method, a semiconductor manufacturing apparatus, and a semiconductor manufacturing method.

BACKGROUND ART

For example, in the semiconductor manufacturing process, a fluid control device is used to control supply of various process gases to a chamber of a semiconductor manufacturing apparatus. For example, in an atomic layer deposition (ALD) method or the like, there is a need for a fluid control device small in size and capable of stably supplying process gases used in a process of depositing a film on a substrate at a more accurate flow rate.

Patent Literature 1 discloses a diaphragm valve used in such a fluid control device. The diaphragm valve comprises a seat removably disposed on a body and a seat holder that restrains the seat on the body. This sheet holder serves to support the periphery of the diaphragm in addition to restraining the seat on the body.

PATENT LITERATURE

PTL 1: Japanese Patent Application Laid-open No. 2015-036563

SUMMARY OF INVENTION

Technical Problem

In the diaphragm valve as disclosed in Patent Literature 1, there was a problem that the variation of flow rate between valves was relatively large.

The present invention has been made in view of the above circumstances, and an object of the present invention is to provide a valve device which can stably supply a fluid with more accurate flow rate and suppress valve-to-valve variation in flow rate, a fluid control device, a fluid control method, a semiconductor manufacturing apparatus and a semiconductor manufacturing method using the valve device.

Solution to Problem

The valve device of the present invention comprises: a valve body made of metallic alloy defining a first flow path and a second flow path;

a valve seat disposed around an opening of the first flow path on the valve body;

an inner disk made of metallic alloy comprising: an inner annular portion that engages the valve seat to restrain the valve seat on the valve body; an outer annular portion disposed on the outer peripheral side of the inner annular portion and in contact with the valve body; and a connecting portion that connects the inner annular portion and the outer annular portion and has a plurality of openings communicating with the second flow path;

a diaphragm made of metallic-alloy, having a peripheral edge portion in contact with the outer annular portion, covering the inner disk and the valve seat and moving between an open position at which the diaphragm does not contact with the valve seat and a closed position at which the diaphragm contacts with the valve seat to enable and shut off communion between the first flow path and the second flow path; and a presser adapter that presses a surface of the peripheral edge portion of the diaphragm opposite to the side of the outer annular portion, toward the outer annular portion to provide seals between the outer annular portion and the diaphragm and between the outer annular portion and the valve body, wherein the inner disk has a hardness higher than the valve seat and lower than both the valve body and the diaphragm.

Preferably, among the valve body, the diaphragm and the inner disk, only the inner disk, or substantially only the inner disk is plastically deformed due to pressing by the presser adapter.

Preferably, the diaphragm has a lower hardness than the valve body, and the inner disk has a lower hardness than the diaphragm.

More preferably, the inner disk has a hardness in a range of from Hv90 to Hv150, and the body has a hardness of Hv200 or higher, and the diaphragm has a hardness in a range of from Hv400 to Hv700.

Preferably, the outer annular portion of the inner disk has a first contact end face portion having an annular shape in contact with the diaphragm and a second contact end face portion having an annular shape in contact with the valve body, and the outer annular portion of the inner disk may be formed so that the area of the second contact end face portion is smaller than the area of the first contact end face portion before undergoing plastic deformation. In this case, the outer annular portion of the inner disk may be formed so that the radial width of the second contact end face portion is smaller than the radial width of the first contact end face portion before undergoing plastic deformation.

The fluid control device of the present invention is a fluid control device comprising a plurality of fluid devices arranged from an upstream side toward a downstream side, wherein the plurality of fluid device includes the above valve device.

The fluid control method of the present invention is a fluid control method comprising using the above-mentioned valve device for adjusting a flow rate of a fluid.

The semiconductor manufacturing apparatus of the present invention is a semiconductor manufacturing apparatus comprising the above valve device used for controlling a process gas in a manufacturing process of a semiconductor device requiring a process step using the process gas in a sealed chamber.

The semiconductor manufacturing method of the present invention is a semiconductor manufacturing method comprising using the above valve device for controlling a flow rate of a process gas in a manufacturing process of a semiconductor device requiring a process step using the process gas in a sealed chamber.

Advantageous Effects of Invention

According to the present invention, it is possible to more stably control the flow rate.

BRIEF DESCRIPTION OF DRAWINGS

FIG. 1 is a partially cross-sectional view showing the configuration of a valve device according to an embodiment of the present invention.

FIG. 2 is an enlarged cross-sectional view showing a closed state in the valve device of FIG. 1.

FIG. 3 is an enlarged cross-sectional view showing an open state in the valve device of FIG. 1.

FIG. 4A is a front view of an inner disk.

FIG. 4B is a cross-sectional view of the inner disk taken along IVB-IVB line of FIG. 4A.

FIG. 5 is an enlarged cross-sectional view of a portion in a circle A in FIG. 4B.

FIG. 6 is an enlarged cross-sectional view showing an example of a plastic deformation of an outer annular portion.

FIG. 7 is an enlarged cross-sectional view showing another example of a plastic deformation of the outer annular portion.

FIG. 8 is a schematic diagram showing an application of the valve device according to an embodiment of the present invention to a semiconductor manufacturing process.

FIG. 9 is a perspective view showing an exemplary fluid control device using the valve device of the present embodiment.

DESCRIPTION OF EMBODIMENTS

Embodiments of the present invention will be described below with reference to the drawings. In the description, the same elements are denoted by the same reference numerals, and repetitive descriptions are omitted as appropriate.

First, referring to FIG. 9, an exemplary fluid control device to which the present invention is applied will be described.

In the fluid control device shown in FIG. 9, a metallic base plate BS arranged along the width direction W1, W2 and extending in the longitudinal directions G1, G2 is provided. Note that W1 represents the front side, W2 represents the back side, G1 represents the upstream side, and G2 represents the downstream side. Various fluid devices 991A to 991E are installed on the base plate BS via a plurality of flow path blocks 992, and a flow path (not shown) through which fluids flow from the upstream side G1 to the downstream side G2 is formed by the plurality of flow path blocks 992.

The term "fluid device" as used herein refers to a device used in a fluid control device that controls the flow of fluids, the device comprises a body that defines a fluid flow path and has at least two flow path ports opening at the surface of the body. Specifically, the fluid device includes an open-close valve (two-way valve) 991A, a regulator 991B, a pressure gauge 991C, an open-close valve (three-way valve) 991D, a mass flow controller 991E, and the like, but is not limited thereto. An introducing pipe 993 is connected to an upstream flow path port of flow path (not shown).

Although the present invention is applicable to various valve devices such as the above-described open-close valves 991A and 991D and the regulator 991B, the present invention will be described by exemplifying an application of the present invention to an open-close valve (three-way valve) in the present embodiment.

FIG. 1 is a cross-sectional view showing a configuration of a valve device 1 according to an embodiment of the present invention in a closed state. FIG. 2 is an enlarged cross-sectional view showing the valve device of FIG. 1 in a closed state. FIG. 3 is an enlarged cross-sectional view showing the valve device 1 of FIG. 1 in an open state.

As shown in FIG. 1, the valve device 1 includes a casing 6, a bonnet 5, a bonnet nut 8, a valve body 2, an inner disk 3, a valve seat 48, a diaphragm 41, a presser adapter 43, a diaphragm presser 42, a stem 44, and a coil spring 45. It is assumed that arrows A1 and A2 in the drawing indicate the vertical direction, A1 indicates the upward direction, and A2 indicates the downward direction.

The valve body 2 is made of stainless steel and defines an upper surface 2a, a bottom surface 2b opposing thereto and side surfaces 2c and 2d facing each other. The valve body 2 defines a first flow path 21 and second flow paths 22, 23. The first flow path 21 and second flow paths 22 and 23 are respectively open at the bottom surface 2b of the valve body. The valve device 1 is a three-way valve that connects and shuts off the first flow path 21 and the second flow paths 22, 23, but the present invention is not limited to this, and the present invention can be applied to a two-way valve as a matter of course.

As shown in FIG. 2 and FIG. 3, the valve body 2 defines a cylindrical portion 24 that extends in the upward direction A1 from the upper surface 2a. A screw portion 25 into which the bonnet nut 8 is screwed is formed on the outer periphery of the cylindrical portion 24. The inner circumferential side of the cylindrical portion 24 defines a valve chamber C1 which houses the valve seat 48, inner disk 3 and the diaphragm 41. On the bottom surface 27 of the valve chamber C1, there is formed an annular groove 26 which communicates with one end of each of the flow paths 22, 23.

The casing 6 incorporates an actuator (not shown) that operates the diaphragm 41, and this actuator is fixed to the bonnet 5 and a movable portion of the actuator is connected to a stem 44 extending in the vertical directions A1 and A2. As the actuator, one driven by a driving gas such as compressed air is used, but the actuator is not limited thereto.

The outer peripheral surface 5a of the lower end portion of the bonnet 5 is fitted to the inner periphery of the cylindrical portion 24 of the valve body 2, and the annular lower end face 5b of the bonnet 5 is in contact with the upper surface of the presser adapter 43. By tightening the bonnet nut 8 screwed into the screw portion 25 of the cylindrical portion 24 of the valve body 2, the bonnet nut 8 is engaged with the protruding portion 5t of the bonnet 5, and the bonnet 5 is pressed downward A2. Between the annular lower end face 5b of the bonnet 5 and the bottom surface 27 of the valve chamber C1 of the valve body 2, the peripheral portion of the diaphragm 41 and the outer annular portion 31 of the inner disk 3 is interposed. In the present embodiment, the presser adapter 43 and the bonnet 5 are separated members, but the bonnet and the presser adapter may be integrally formed.

Inside the bonnet 5, the stem 44 is biased by a coil spring 45 in the downward direction A2 with respect to the bonnet 5, that is, in the direction of moving the diaphragm 41 to the closed position.

The diaphragm presser 42 is fitted into the recess 44a formed in the lower end portion of the stem 44. The diaphragm presser 42 is made of a synthetic resin such as polyimide which abuts the central portion of the upper surface of the diaphragm 41. In the present embodiment, the coil spring 45 is used, but the present invention is not limited to this, and other types of elastic members such as a disc spring and a leaf spring can be used.

An annular protrusion 2k is formed around the opening of the flow path 21 on the bottom surface 27 of the valve chamber C1 of the valve body 2, and the valve seat 48 is fitted to the inner periphery of the annular protrusion 2k to be positioned on the bottom surface 27 of the valve chamber C1. The valve seat 48 is made of a resin such as PFA, PA, PI, PTFE, etc., but as described later, it may be a softer metal than inner disk 3.

The inner disk 3 is disposed in the valve chamber C1, and has an inner annular portion 32, an outer annular portion 31, and a connecting portion 37 as shown in the FIGS. 4A, 4B. The inner disk 3 is made of a metallic material such as stainless steel alloy.

The inner annular portion 32 is disposed around the opening of the first flow path 21 and has an opening 33. The outer annular portion 31 has an annular shape concentric with the inner annular portion 32. The connecting portion 37 connects the inner annular portion 32 and the outer annular portion 31 and has a plurality of openings 34 communicating with the second flow path 22.

The outer peripheral surface of the outer annular portion 31 is fitted to the inner peripheral surface of the cylindrical portion 24 of the valve body 2. The first contact end face portion 31/1 having an annular shape on the upper side of the outer annular portion 31 contacts the lower surface of the peripheral edge portion of the diaphragm 41. The second contact end face portion 31/2 having an annular shape on the lower side of the outer annular portion 31 contacts the flat bottom surface 27 of the valve chamber C1 of the valve body 2.

The shape of the inner peripheral surface of the opening 33 of the inner annular portion 32 and the shape of the outer peripheral surface of the valve seat 48 are formed to match with each other, and the inner peripheral surface of the opening 33 of the inner annular portion 32 is fitted from above onto the outer peripheral surface of the valve seat 48 positioned on the flat bottom surface 27 of the valve chamber C1 of the valve body 2, whereby the valve seat 48 is pressed against the bottom surface 27 by the inner annular portion 32 and is restrained on the bottom surface 27.

The diaphragm 41 has a peripheral edge in contact with the first contact end face portion 31/1 of the outer annular portion 31 of the inner disk 3, covers the inner disk 3 and the valve seat 48, and defines a flow path connecting the flow path 21 with flow paths 22, 23. The diaphragm 41 connects and shuts off the first flow path 21 and the second flow path 22, 23 by moving between a closed position at which the diaphragm contacts with the valve seat 48 and an open position at which the diaphragm does not contact with the valve seat 48. The diaphragm 41 is made of, for example, a nickel alloy thin plate, cut out in a circular, and formed in an inverted dish shape in which the central portion is bulged upward. The diaphragm may be made of, for example, a stainless steel sheet or a laminate of a stainless steel sheet and a nickel-cobalt alloy sheet. Further, the diaphragm 41 may be a single diaphragm or a laminate obtained by laminating a plurality, and can be freely selected according to specifications and conditions.

The diaphragm presser 42 is always biased in the downward direction A2 by the restoring force of the coil spring 45, and as shown in FIG. 2, when the vicinity of the central portion of the diaphragm 41 is pressed by the diaphragm presser 42, the diaphragm 41 is deformed and pressed to the valve seat 48. As a result, the flow path between the first flow path 21 and the second flow paths 22, 23 is closed.

When an actuator (not shown) is actuated to move the stem 44 in the upward direction A1, as shown in FIG. 3, the diaphragm 41 moves away from the valve seat 48. As a result, the flow path between the flow path 21 and the flow paths 22, 23 is opened, and the flow path 21 and the flow paths 22, 23 communicate with each other.

In the valve device 1 of the above structure, in order to reliably provide seals between the peripheral portion of the diaphragm 41 and the outer annular portion 31 of inner disk 3 and between the outer annular portion 31 of inner disk 3 and the valve body 2, the bonnet nut 8 is tightened to exert a force to push the presser adapter 43 downward A2 by the lower end surface 5b of the bonnet 5, and the presser adapter 43 presses the surface of the peripheral portion of the diaphragm 41 opposite to the side of the outer annular portion 31 toward the outer annular portion 31.

Consequently, a plastic deformation that occurs between the diaphragm 41 and the inner disk 3 and between the valve body 2 and the inner disk 3 provide close seal between the members.

Structure of the Outer Annular Portion

FIG. 5 shows an enlarged cross-sectional view of a circle A in FIG. 4B.

As shown in FIG. 5, the outer annular portion 31 of the inner disk 3 has a first contact end face portion 31/1 that is an annular flat surface in contact with the peripheral portion of the diaphragm 41 on the upper end side, and a second contact end face portion 31/2 that is an annular flat surface in contact with the bottom surface 27 of the valve chamber C1 of the valve body 2 on the lower end side. The inner disk 3 contacts the diaphragm 41 only at the first contact end face portion 31/1, and the diaphragm 41 is supported by the first contact end face portion 31/1. The inner disk 3 is in contact with the bottom surface 27 of the valve chamber C1 of the valve body 2 only at the second contact end face portion 31/2. The inner annular portion 32 of the inner disk 3 is not in contact with the bottom surface 27 of the valve chamber C1 of the valve body 2.

An important point is that the width X2 in the radial direction of the second contact end face portion 31/2 is formed to be smaller than the width X1 in the radial direction of the first contact end face portion 31/1. In the present embodiment, since the second contact end face portion 31/2 is located directly below the first contact end face portion 31/1 in the vertical directions A1, A2, the total area of the second contact end face portion 31/2 is smaller than the total area of the first contact end face portion 31/1.

The second contact end face portion 31/2 may be positioned closer to the inner periphery or the outer periphery with respect to the first contact end face portion 31/1, but the total area of the second contact end face portion 31/2 needs to be smaller than the total area of the first contact end face portion 31/1.

The reason why the structure of FIG. 5 is adopted for the outer annular portion 31 will be described later.

In order to suppress the variation in the flow rate between the plurality of valve device 1, control of tightening torque of the bonnet nut 8 has conventionally been conducted.

However, in reality, only by controlling the tightening torque of bonnet nut 8, it is not possible to sufficiently suppress the variation of the flow rate between the plurality of valve device 1.

The present inventors have focused on the plastic deformation that occurs between the diaphragm 41 and the inner disk 3 and between the valve body 2 and the inner disk 3 as one of the reasons for the variation in the flow rate between the plurality of valve device 1. That is, the relative positional relation between the diaphragm 41 and the valve seat 48 is considered to vary greatly depending on the amount of plastic deformation occurring between the diaphragm 41, the inner disk 3 and the valve body 2 and the amount of deformation of the valve seat 48 made of resin. In a configuration in which plastic deformation occurs in each of the members, it is not easy to precisely control the relative positional relationship between the diaphragm 41 and the valve seat 48.

Therefore, the present inventors have adjusted the relative hardness between the members that are the diaphragm 41, the inner disc 3, and the valve body 2, and invented a configuration in which plastic deformation occurs only to the inner disk 3 or substantially only on the inner disc 3 by receiving a pressing force from the presser adapter 43.

Specifically, assuming that the hardness of the valve seat 48 is H1, the hardness of inner disk 3 is H2, the hardness of the diaphragm 41 is H3, and the hardness of the valve body 2 is H4, the hardness H1 to H4 are adjusted so as to satisfy the following equation (1).

$$H1<H2<H3,H4 \qquad (1)$$

More specifically, the hardness H1 of the valve seat 48 is adjusted to be within a range of from Hv(30) to Hv80 (converted from Rockwell because it cannot be measured by Vickers), the hardness H2 of inner disk 3 is adjusted to be within a range of from Hv90 to Hv150, the hardness H3 of the diaphragm 41 is adjusted to be within a range of from Hv400 to Hv700, and the hardness H4 of the valve body 2 is adjusted to be within a range of from Hv200 to Hv400.

By employing a configuration in which plastic deformation occurs only in the inner disk 3 in the assembly of the valve device, it is possible to limit the factors that affect the relative positional relationship between the diaphragm 41 and the valve seat 48 to the plastic deformation of the inner disk 3, and by precisely controlling the hardness of the inner disk 3, it is possible to control the relative positional relationship between the diaphragm 41 and the valve seat 48, thereby enabling suppression of variations in the flow rate between the plurality of valve devices 1.

Next, an operation of the structure of the outer annular portion 31 shown in FIG. 5 will be described.

FIG. 6 and FIG. 7 show an example in which the outer annular portion 31 of the inner disk 3 is subjected to a pressing force from the presser adapter 43, and the second contact end face portion 31/2 is plastically deformed. Incidentally, in FIGS. 6 and 7, the plastic deformation in the first contact end face portion 31/1 is omitted.

When the outer annular portion 31 of the inner disk 3 receives a force F1 from the presser adapter 43 through the periphery of the diaphragm 41, the second contact end face portion 31/2 receives a reaction force F2 from the bottom surface 27 of the valve body 2. The force F1 and the reaction force F2 are directed in opposite directions and have the same magnitude.

The second contact end face portion 31/2 is plastically deformed by receiving a reaction force F2, and there may be a case where a part of the second contact end face portion 31/2 of the outer annular portion 31 is deformed so as to protrude to the inner peripheral side and the outer peripheral side as shown in FIG. 6, and a case where a part of the second contact end face portion 31/2 of the outer annular portion 31 is plastically deformed eccentrically to the inner peripheral side as shown in FIG. 7.

The important point is that forces of the same magnitude act in the opposite directions on the first contact end face portion 31/1 and the second contact end face portion 31/2, but the total area of the second contact end face portion 31/2 is smaller than the total area of the first contact end face portion 31/1. Therefore, the stress generated in the second contact end face portion 31/2 becomes larger than the stress generated in the first contact end face portion 31/1, and the amount of plastic deformation of the second contact end face portion 31/2 is relatively larger as compared with the amount of plastic deformation of the first contact end face portion 31/1. Along with the plastic deformation of the second contact end face portion 31/2, the valve seat 48 is also pressed toward the bottom surface 27 of the valve body 2 by the inner annular portion 32, and is deformed by an amount corresponding to the amount of plastic deformation of the second contact end face portion 31/2. Even if the amount of plastic deformation of the second contact end face portion 31/2 is relatively increased, the position of the contact surface of the valve seat 48 with the diaphragm 41 in the vertical directions A1 and A2 and the position of the diaphragm 41 in the vertical directions A1 and A2 also move in the downward direction A2. As a result, the relative positional relationship between the diaphragm 41 and the valve seat 48 is maintained.

On the other hand, by relatively reducing the stress generated in the first contact end face portion 31/1, the amount of plastic deformation of the first contact end face portion 31/1 becomes relatively small, and the variation in the relative positional relationship between the diaphragm 41 and the valve seat 48 becomes also relatively small.

When the amount of plastic deformation of the second contact end face portion 31/2 of the outer annular portion 31 is relatively increased, the adhesion between the bottom surface 27 of the valve body 2 and the second contact end face portion 31/2 is increased, and the sealability between the second contact end face portion 31/2 and the bottom surface 27 is improved.

Even if the amount of plastic deformation of the first contact end face portion 31/1 of the outer annular portion 31 is relatively reduced, since the pressing force of the presser adapter 43 acts on the inner disk 3 through the first contact end face portion 31/1, the sealability between the diaphragm 41 and the first contact end face portion 31/1 is not significantly reduced.

According to the present embodiment, by adjusting the relative hardness between the members, the member subjected to plastic deformation in the assembly of the valve device 1 is limited to the inner disk 3 alone, and by accurately controlling the hardness of the inner disk 3, it is possible to easily and more accurately control the relative positional relationship between the diaphragm 41 and the valve seat 48. Consequently, it is possible to suppress the variation in the flow rate that occurs between the plurality of valve devices 1.

Further, according to the present embodiment, by adjusting the relative areas of the first contact end face portion 31/1 and the second contact end face portion 31/2 of the outer annular portion 31 of the inner disk 3, it is possible to adjust the stresses generated in the first contact end face portion 31/1 and the second contact end face portion 31/2, and it is possible to relatively increase the amount of plastic deformation of the second contact end face portion 31/2. As a result, it is possible to improve the sealing between the second contact end face portion 31/2 and the valve body 2 while suppressing the variation in the relative positional relationship between the diaphragm 41 and the valve seat 48.

Next, referring to FIG. 8, an application of the above-described valve device 1 will be described.

Semiconductor manufacturing apparatus 980 shown in FIG. 8 is an apparatus for performing a semiconductor manufacturing process by ALD method, where 981 is a process gas supply source, 982 is a gas box, 983 is a tank, 984 is a control unit, 985 is a processing chamber, and 986 is an exhaust pump.

In the semiconductor manufacturing process by the ALD method, it is necessary to precisely adjust the flow rate of the process gas, and along with the increase of the diameter of the substrate, it is also necessary to ensure a certain amount of flow rate of the process gas.

The gas box 982 is an integrated gas system (fluid control device) housed in the box by integrating various fluid control devices such as open-close valves, regulators, mass flow controllers, etc. in order to supply accurately metered process gas to the processing chamber 985.

The tank 983 functions as a buffer for temporarily storing the process gas supplied from the gas box 982.

The control unit 984 executes flow rate adjusting control by supply control of the operating gases to valve device 1.

The processing chamber 985 provides a sealed processing space for forming a film on a substrate by the ALD method.

The exhaust pump 986 draws a vacuum within the processing chamber 985.

According to the above-described system configuration, since a process gas with an accurate flow rate can be stably supplied to the processing chamber, the wafer can be uniformly deposited.

Note that the present invention is not limited to the above-described embodiment. Various additions, modifications and the like can be made by those skilled in the art within the scope of the present invention. For example, in the above application example, the case where valve device 1 is used in the semiconductor manufacturing process by the ALD method has been exemplified, but the present invention is not limited to this case, and the present invention can be applied to any object that requires precise flow rate control, such as an atomic layer etching (ALE method), for example.

In the above embodiment, as an actuator, a piston incorporated in the cylinder operated by gas pressure is used, but the present invention is not limited to this, and it is possible to select various optimal actuator according to the control object.

In the above embodiment, the valve device 1 is configured to place the outside of the gas box 982 as a fluid control device, but it is also possible to include the valve device 1 of the above embodiment in a fluid control device in which various fluid devices such as open-close valves, a regulator, a mass flow controller are integrated and housed in a box.

In the above embodiment, the valve device is mounted on a plurality of flow path blocks 992 in a fluid control device, but the valve device of the present invention can be applied to an integrated flow path block or a baseplate in addition to the divided flow path block 992.

REFERENCE SIGNS LIST

1: Valve device
2: Valve body
2*a*: Upper surface
2*b*: Bottom surface
2*c*,2*d*: Side surface
2*k*: Protrusion
3: Inner disk
5: Bonnet
5*a*: Outer surface
5*b*: Lower end face
5*t*: Protruding portion
6: Casing
8: Bonnet nut
21: First flow path
22,23: Second flow path
24: Cylindrical portion
25: Screw portion
26: Annular groove
27: Bottom surface
31: Outer annular portion
31*f*1: First contact end face portion
31*f*2: Second contact end face portion
32: Inner annular portion
33: Opening
34: Opening
37: Connecting portion
41: Diaphragm
42: Diaphragm presser
43: Presser adapter
44: Stem
44*a*: Recess
45: Coil spring
48: Valve seat
980: Semiconductor manufacturing apparatus
981: Process gas supply source
982: Gas box
983: Tank
984: Control unit
985: Processing chamber
986: Exhaust pump
991A: Open-close valve (fluid device)
991B: Regulator (fluid device)
991C: Pressure gauge (fluid device)
991D: Open-close valve (fluid device)
991E: Mass flow controller (fluid device)
992: flow path block
993: Introducing pipe
A1: Upward direction
A2: Downward direction
BS: Base plate
C1: Valve chamber
G1: longitudinal direction upstream side
G2: Longitudinal direction downstream side
H1-H4: Hardness
W1: Width direction front side
W2: Width direction back side
X1: First contact end face width
X2: Second contact end face width

The invention claimed is:

1. A valve device comprising:
a valve body made of metallic-alloy defining a first flow path and a second flow path and having an annular protrusion formed around an opening of the first flow path;
a valve seat having an inner periphery fitted to the outer periphery of the annular protrusion and disposed on the valve body;
an inner disk made of metallic-alloy comprising: an inner annular portion that engages the valve seat to restrain the valve seat on the valve body; an outer annular portion disposed on the outer peripheral side of the inner annular portion and in contact with the valve body; and a connecting portion that connects the inner annular portion and the outer annular portion and has a plurality of openings communicating with the second flow path;
a diaphragm made of metallic-alloy, having a peripheral edge portion in contact with the outer annular portion, covering the inner disk and the valve seat and moving between an open position at which the diaphragm does not contact with the valve seat and a closed position at which the diaphragm contacts with the valve seat to enable and shut off communication between the first flow path and the second flow path; and a presser adapter that presses a surface of the peripheral portion of the diaphragm opposite to the side of the outer annular portion toward the outer annular portion to provide seals between the outer annular portion and the diaphragm and between the outer annular portion and the valve body, wherein the inner disk has a hardness higher than the valve seat and lower than both the valve body and the diaphragm.

2. The valve device according to claim 1, wherein among the valve body, the diaphragm and the inner disk, only the inner disk or substantially only the inner disk is plastically deformed due to pressing by the presser adapter.

3. The valve device according to claim 2, wherein the inner disk has a hardness in a range of from Hv90 to Hv150.

4. The valve device according to claim 3, wherein the valve body has a hardness of Hv200 or higher, and the diaphragm has a hardness in a range of from Hv400 to Hv700.

5. The valve device according to claim 1, wherein the outer annular portion of the inner disk has a first contact end face portion having an annular shape in contact with the diaphragm and a second contact end face portion having an annular in contact with the valve body, and the outer annular portion of the inner disk is formed so that the area of the second contact end face portion is smaller than the area of the first contact end face portion before undergoing plastic deformation.

6. The valve device according to claim 5, wherein the outer annular portion of the inner disk is formed so that the radial width of the second contact end face portion is smaller than the radial width of the first contact end face portion before undergoing plastic deformation.

7. A fluid control device comprising a plurality of fluid devices arranged from an upstream side toward a downstream side, wherein the plurality of fluid devices includes the valve device as claimed in claim 1.

8. A flow rate control method comprising using the valve device as claimed in claim 1 for adjusting a flow rate of a fluid.

* * * * *